(12) United States Patent
Ishiguro et al.

(10) Patent No.: US 10,270,404 B2
(45) Date of Patent: Apr. 23, 2019

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventors: Tetsuro Ishiguro, Kawasaki (JP); Norikazu Nakamura, Sagamihara (JP); Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 61 days.

(21) Appl. No.: 15/275,429

(22) Filed: Sep. 25, 2016

(65) Prior Publication Data

US 2017/0125563 A1    May 4, 2017

(30) Foreign Application Priority Data

Oct. 30, 2015  (JP) .................. 2015-215007

(51) Int. Cl.
| | |
|---|---|
| *H01L 29/778* | (2006.01) |
| *H03F 3/19* | (2006.01) |
| *H01L 29/66* | (2006.01) |
| *H01L 29/20* | (2006.01) |
| *H03F 1/32* | (2006.01) |
| *H03F 3/24* | (2006.01) |
| *H01L 29/201* | (2006.01) |

(Continued)

(52) U.S. Cl.
CPC .............. *H03F 3/19* (2013.01); *H01L 29/201* (2013.01); *H01L 29/2003* (2013.01); *H01L 29/66462* (2013.01); *H01L 29/7786* (2013.01); *H03F 1/3247* (2013.01); *H03F 3/245* (2013.01); *H01L 29/207* (2013.01); *H02M 1/4225* (2013.01); *H03F 2200/204* (2013.01); *H03F 2200/333* (2013.01)

(58) Field of Classification Search
None
See application file for complete search history.

(56) References Cited

U.S. PATENT DOCUMENTS

| | | |
|---|---|---|
| 2008/0237610 A1 | 10/2008 | Imanishi et al. |
| 2010/0207124 A1 | 8/2010 | Imanishi et al. |
| 2010/0207167 A1 | 8/2010 | Imanishi et al. |

(Continued)

FOREIGN PATENT DOCUMENTS

| | | |
|---|---|---|
| JP | 2008-251966 | 10/2008 |
| JP | 2008-288474 | 11/2008 |

(Continued)

*Primary Examiner* — Cheung Lee
*Assistant Examiner* — Scott Stowe
(74) *Attorney, Agent, or Firm* — Fujitsu Patent Center (57) ABSTRACT

A compound semiconductor device includes: a first layer of nitride semiconductor, the first layer being doped with Fe; a channel layer of nitride semiconductor above the first layer; and a barrier layer of nitride semiconductor above the channel layer, wherein the channel layer includes: a two-dimensional electron gas region in which the two-dimensional electron gas exists; and an Al-containing region between the two-dimensional electron gas region and the first layer, an Al concentration in the Al-containing region being $5\times10^{17}$ atoms/cm$^3$ or more and less than $1\times10^{19}$ atoms/cm$^3$.

10 Claims, 12 Drawing Sheets

(51) Int. Cl.
*H02M 1/42* (2007.01)
*H01L 29/207* (2006.01)

(56) References Cited

U.S. PATENT DOCUMENTS

| | | | |
|---|---|---|---|
| 2010/0244098 | A1 | 9/2010 | Yokoyama |
| 2012/0067275 | A1 | 3/2012 | Imanishi et al. |
| 2013/0200389 | A1* | 8/2013 | Lee .................. H01L 29/205 257/76 |
| 2013/0256682 | A1* | 10/2013 | Ishiguro ............ H01L 29/66477 257/76 |
| 2014/0252369 | A1* | 9/2014 | Lee .................. H01L 29/7787 257/76 |

FOREIGN PATENT DOCUMENTS

| | | |
|---|---|---|
| JP | 2010-182872 | 8/2010 |
| JP | 2010-232297 | 10/2010 |

* cited by examiner

FIG. 12

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2015-215007, filed on Oct. 30, 2015, the entire contents of which are incorporated herein by reference.

FIELD

The embodiments discussed herein are directed to a compound semiconductor device and a method of manufacturing the same.

BACKGROUND

Characteristics can be improved by providing a layer in which Fe is introduce at a position under a channel layer in a high electron mobility transistor (HEMT) which contains a gallium nitride (GaN)-based material. Fe forms a deep acceptor level in the vicinity of valence band of GaN, and an electron is captured in the acceptor level, so that leakage current in a thickness direction is suppressed, and pinch-off characteristics are improved.

However, Fe may be diffused from the layer doped with Fe to a region in which two-dimensional electron gas (2DEG) exists in the channel layer, and in this case, mobility of electron is lowered. A structure is proposed for the purpose of suppressing the reduction in the mobility of electron as above, in which a layer of AlN or AlGaN whose Al composition exceeds 40% is disposed between the layer doped with Fe and the GaN channel layer. However, even with this structure, it is not possible to obtain sufficient characteristics.

Patent Literature 1: Japanese Laid-Open Patent Publication No. 2010-182872

Patent Literature 2: Japanese Laid-Open Patent Publication No. 2010-232297

Patent Literature 3: Japanese Laid-Open Patent Publication No. 2008-288474

Patent Literature 4: Japanese Laid-Open Patent Publication No. 2008-251966

SUMMARY

According to an aspect of the embodiments, a compound semiconductor device includes: a first layer of nitride semiconductor, the first layer being doped with Fe; a channel layer of nitride semiconductor above the first layer; and a barrier layer of nitride semiconductor above the channel layer, wherein the channel layer includes: a two-dimensional electron gas region in which the two-dimensional electron gas exists; and an Al-containing region between the two-dimensional electron gas region and the first layer, an Al concentration in the Al-containing region being $5 \times 10^{17}$ atoms/cm$^3$ or more and less than $1 \times 10^{19}$ atoms/cm$^3$.

According to another aspect of the embodiments, a method of manufacturing a compound semiconductor device includes: forming a channel layer of nitride semiconductor above a first layer of nitride semiconductor, the first layer being doped with Fe; and forming a barrier layer of nitride semiconductor above the channel layer, wherein the forming the channel layer includes forming an Al-containing region between a two-dimensional electron gas region in which the two-dimensional electron gas exists and the first layer, an Al concentration in the Al-containing region being $5 \times 10^{17}$ atoms/cm$^3$ or more and less than $1 \times 10^{19}$ atoms/cm$^3$.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The inventors of the present application repeatedly conducted earnest studies for finding out the reason why it is not possible to obtain the sufficient characteristics even with the conventional technique. As a result, it was clarified that dislocation due to a large difference in lattice constant between a layer of AlN or AlGaN whose Al composition exceeds 40% and a GaN channel layer, exists in the GaN channel layer in a high density, and leakage current flows via the dislocation or an electron is trapped by the dislocation. As a result of further earnest studies repeatedly conducted by the inventors of the present application based on such findings, the inventors of the present application arrived at the following various embodiments.

Hereinafter, embodiments will be concretely described while referring to the attached drawings.

(First Embodiment)

Figure 1:
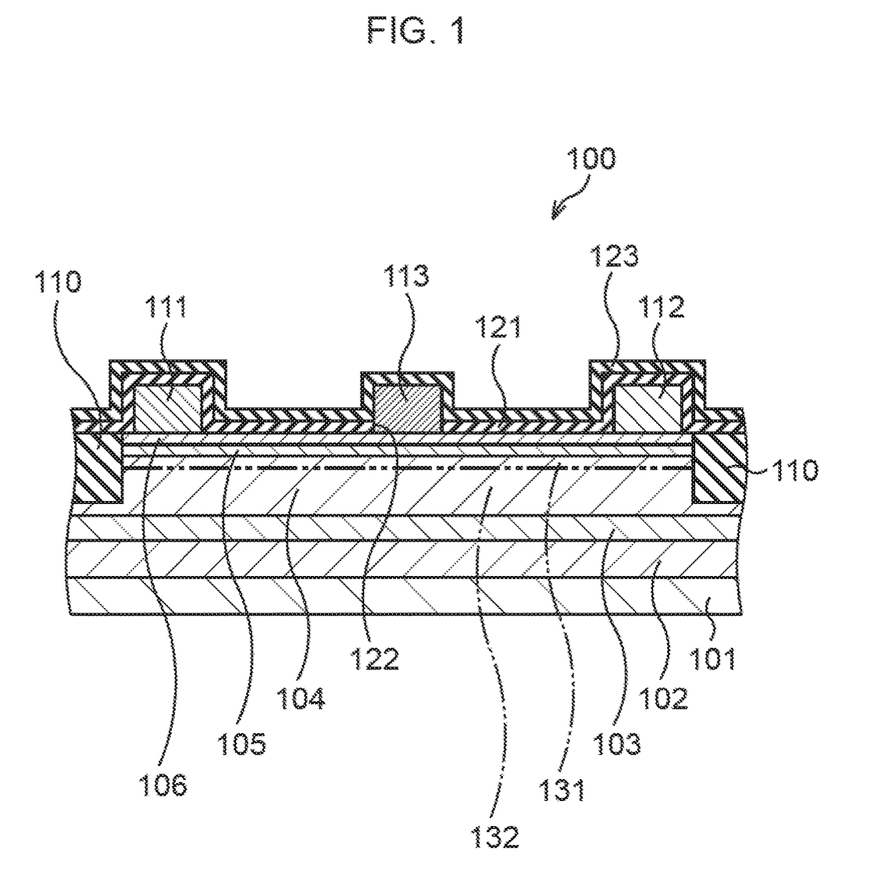
FIG. 1 is a sectional view illustrating a structure of a compound semiconductor device according to a first embodiment.

First, a first embodiment will be described. The first embodiment relates to an example of a compound semiconductor device with HEMT. FIG. 1 is a sectional view illustrating a structure of the compound semiconductor device according to the first embodiment.

As illustrated in FIG. 1, a compound semiconductor device 100 according to the first embodiment includes a substrate 101, a buffer layer 102 on the substrate 101, and a first layer 103 of nitride semiconductor on the buffer layer 102. The compound semiconductor device 100 also includes a channel layer (carrier transit layer) 104 on the first layer 103, a barrier layer (carrier supply layer) 105 on the channel layer 104, and a cap layer 106 on the barrier layer 105.

The substrate 101 is, for example, a sapphire substrate, a Si substrate, or a SiC substrate. The substrate 101 is preferably a high-resistance substrate in order to suppress leakage current in a thickness direction. The buffer layer 102 is, for example, a GaN layer, an AlN layer, an AlGaN layer, or an InAlGaN layer, and a thickness of the buffer layer 102 is about 5 nm to 500 nm, for example. The buffer layer 102 may include a plurality of AlGaN layers whose composition changes stepwise, it may include a periodical structure of GaN thin film and AlN thin film (superlattice structure), and it may include a composition in which a proportion of Al continuously changes from AlN to GaN. The first layer 103 contains a nitride semiconductor such as GaN or AlGaN doped with Fe. An Fe concentration in the first layer 103 is $1\times10^{16}$ atoms/cm$^3$ to $1\times10^{18}$ atoms/cm$^3$, and a thickness of the first layer 103 is about 100 nm to 400 nm. The first layer 103 is, for example, a GaN layer with an Fe concentration of $3\times10^{17}$ atoms/cm$^3$, and a thickness of about 300 nm.

The channel layer 104 is, for example, a GaN layer including an Al concentration of $5\times10^{17}$ atoms/cm$^3$ or more and less than $1\times10^{19}$ atoms/cm$^3$, and the GaN layer has not been intentionally doped with impurity other than Al. A thickness of the channel layer 104 is about 1000 nm, for example. The barrier layer 105 is of a material which generates two-dimensional electron gas in the vicinity of an upper surface of the channel layer 104, and is an AlGaN layer whose thickness is about 20 nm, for example. The cap layer 106 is, for example, a GaN layer with a thickness of about 5 nm.

An element isolation region 110 demarcating an element region is formed in the stack of the cap layer 106, the barrier layer 105, and the channel layer 104. A source electrode 111 and a drain electrode 112 are formed on the cap layer 106 in the element region.

An insulating film 121 covering the source electrode 111 and the drain electrode 112 is formed on the cap layer 106. An opening 122 is formed between the source electrode 111 and the drain electrode 112 in the insulating film 121, and a gate electrode 113 is formed which is in contact with the cap layer 106 via the opening 122. An insulating film 123 covering the gate electrode 113 is formed on the insulating film 121. A material of the insulating film 121 and the insulating film 123 is not particularly limited, and a silicon nitride film is used, for example.

The channel layer 104 includes a two-dimensional electron gas (2DEG) region 131 in which two-dimensional electron gas exists, and an Al-containing region 132 between the 2DEG region 131 and the first layer 103. An Al concentration in the Al-containing region 132 is $5\times10^{17}$ atoms/cm$^3$ or more and less than $1\times10^{19}$ atoms/cm$^3$. The 2DEG region 131 may contain Al at a concentration of $5\times10^{17}$ atoms/cm$^3$ or more and less than $1\times10^{19}$ atoms/cm$^3$. A maximum value of the Al concentration between the 2DEG region 131 and the first layer 103 is less than $1\times10^{19}$ atoms/cm$^3$.

The first embodiment includes the first layer 103, so that the leakage current in the thickness direction can be suppressed, resulting in that good pinch-off characteristics can be obtained. Since the Al-containing region 132 is disposed between the 2DEG region 131 and the first layer 103, it is possible to suppress diffusion of Fe from the first layer 103 to the 2DEG region 131. For example, the Fe concentration in the 2DEG region 131 is $5\times10^{15}$ atoms/cm$^3$ or less. The diffusion of Fe can be sufficiently suppressed even if the Al concentration in the Al-containing region 132 is $5\times10^{17}$ atoms/cm$^3$ or more and less than $1\times10^{19}$ atoms/cm$^3$. An Al composition of the Al-containing region 132 is less than 1% even when the Al concentration is $1\times10^{19}$ atoms/cm$^3$. Since the Al concentration in the Al-containing region 132 is $5\times10^{17}$ atoms/cm$^3$ or more and less than $1\times10^{19}$ atoms/cm$^3$, a dislocation density in the 2DEG region 131 is low. Therefore, the leakage current via the dislocation is difficult to flow, and the trap of electron by the dislocation is difficult to occur.

Figure 2A:
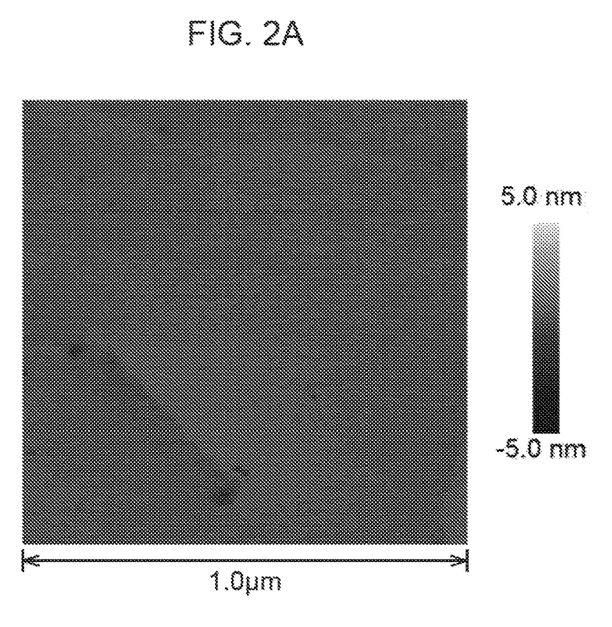
FIG. 2A and FIG. 2B are drawings each illustrating a microscopic observation image of a GaN layer containing Al.
Figure 2B:
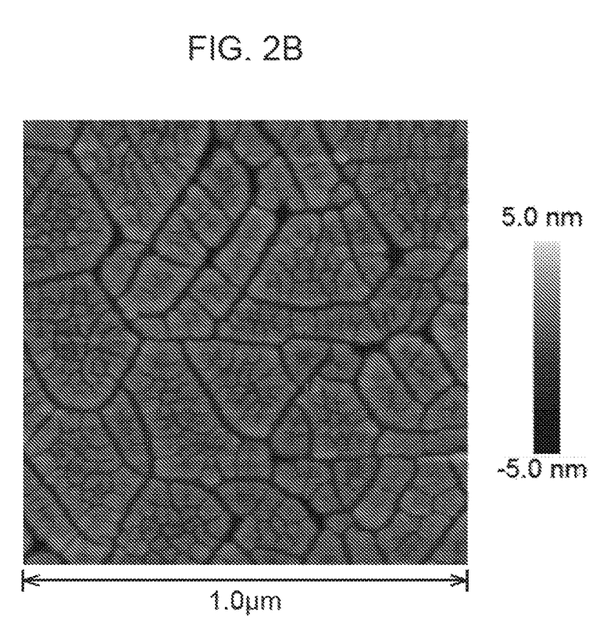

If the Al concentration in the Al-containing region 132 is less than $5\times10^{17}$ atoms/cm$^3$, it is not possible to sufficiently suppress the diffusion of Fe from the first layer 103. Therefore, the Al concentration in the Al-containing region 132 is $5\times10^{17}$ atoms/cm$^3$ or more. For example, even when an Al source is not supplied during formation of the channel layer 104, the channel layer 104 slightly contains Al diffused from the layers such as the buffer layer 102 and the barrier layer 105, but it is not possible to sufficiently suppress the diffusion of Fe with the diffused Al. If the Al concentration in the Al-containing region 132 is $1\times10^{19}$ atoms/cm$^3$ or more, the dislocation density in the 2DEG region 131 is too high. FIG. 2A illustrates a microscopic observation image of a GaN layer with an Al concentration of $5\times10^{17}$ atoms/cm$^3$, and FIG. 2B illustrates a microscopic observation image of a GaN layer with an Al concentration of $1\times10^{19}$ atoms/cm$^3$. As illustrated in FIG. 2A and FIG. 2B, when the Al concentration is $1\times10^{19}$ atoms/cm$^3$ or more, surface morphology is low. Therefore, the Al concentration in the Al-containing region 132 is less than $1\times10^{19}$ atoms/cm$^3$. The Al concentration in the Al-containing region 132 is desirably substantially equal to or higher by about one digit than the Fe concentration in the first layer 103 within a range of $5\times10^{17}$ atoms/cm$^3$ or more and less than $1\times10^{19}$ atoms/cm$^3$. For example, the Fe concentration in the first layer 103 is lower than the Al concentration in the Al-containing region 132.

Next, a method of manufacturing the compound semiconductor device according to the first embodiment will be described. FIG. 3A to FIG. 3F are sectional views illustrating the method of manufacturing the compound semiconductor device according to the first embodiment in order of processes.

Figure 3A:
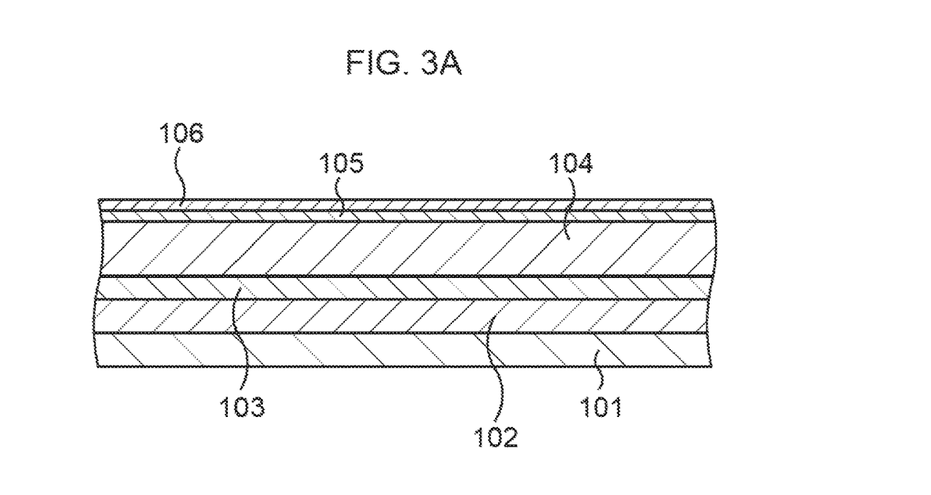
FIG. 3A to FIG. 3F are sectional views illustrating a method of manufacturing the compound semiconductor device according to the first embodiment in order of processes.

First, the substrate 101 is subjected to heat treatment in H$_2$ atmosphere for a few minutes, and thereafter, as illustrated in FIG. 3A, the buffer layer 102, the first layer 103, the channel layer 104, the barrier layer 105, and the cap layer 106 are formed on the substrate 101. For example, a thickness of the first layer 103 is about 300 nm, and a doping concentration of Fe in the first layer 103 is about $3\times10^{17}$ atoms/cm$^3$. A thickness of the channel layer 104 is about 1000 nm, and a doping concentration of Al in the channel layer 104 is about $1\times10^{18}$ atoms/cm$^3$. The buffer layer 102, the first layer 103, the channel layer 104, the barrier layer 105, and the cap layer 106 may be formed by a crystal growth method such as a metal organic vapor phase epitaxy (MOVPE) method.

When these compound semiconductor layers are formed, mixed gas may be used of trimethylaluminum (TMA) gas being an Al source, trimethylgallium (TMG) gas being a Ga source, and ammonia ($NH_3$) gas being an N source, for example. In accordance with the composition of the compound semiconductor layer to be grown, the presence/absence of supply and the flow rate of the trimethylaluminum gas and the trimethylgallium gas are appropriately controlled. $Cp_2Fe$ (cyclopentadienyl iron, ferrocene) may be used as a source of Fe, for example. $H_2$ gas may be used as carrier gas, for example.

Figure 3B:
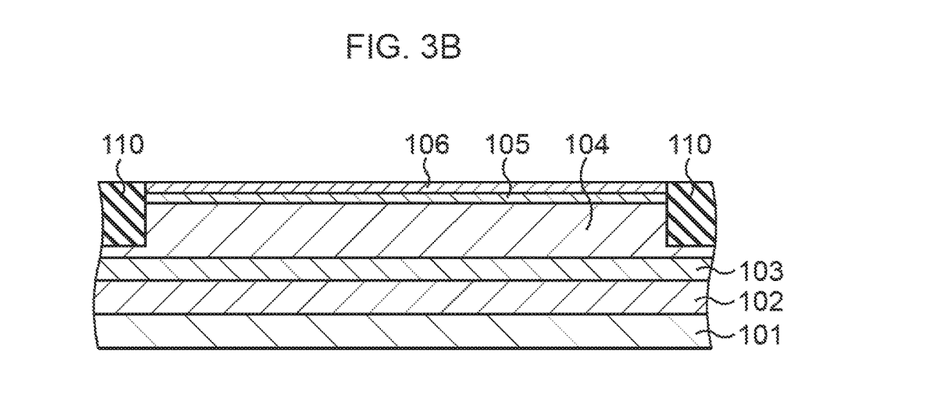

Then, as illustrated in FIG. 3B, the element isolation region 110 demarcating the element region is formed in the cap layer 106, the barrier layer 105, and the channel layer 104. In the formation of the element isolation region 110, for example, a pattern of photoresist exposing a region in which the element isolation region 110 is to be formed is formed on the cap layer 106, and ion implantation of Ar is performed while using this pattern as a mask. Dry etching may be performed in which chlorine gas is employed while using this pattern as an etching mask.

Figure 3C:
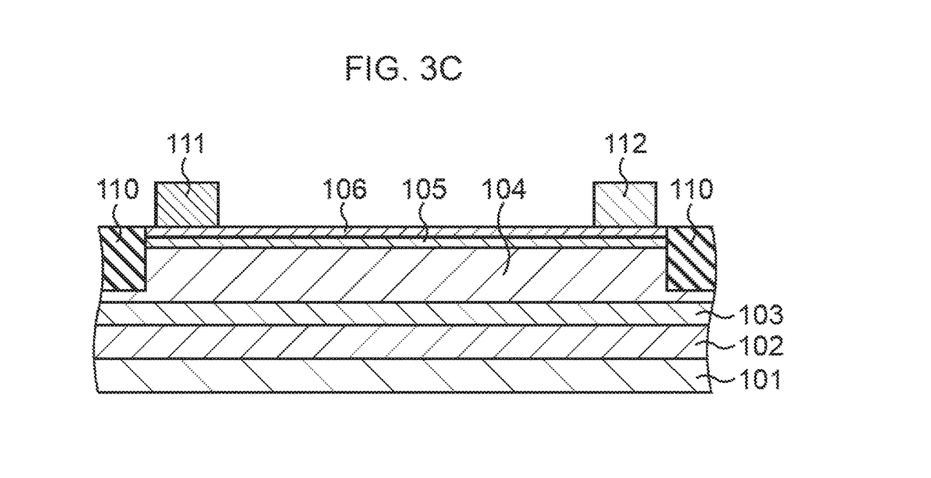

Thereafter, as illustrated in FIG. 3C, the source electrode 111 and the drain electrode 112 are formed on the cap layer 106 in the element region. The source electrode 111 and the drain electrode 112 may be formed by a lift-off method, for example.

Figure 3D:
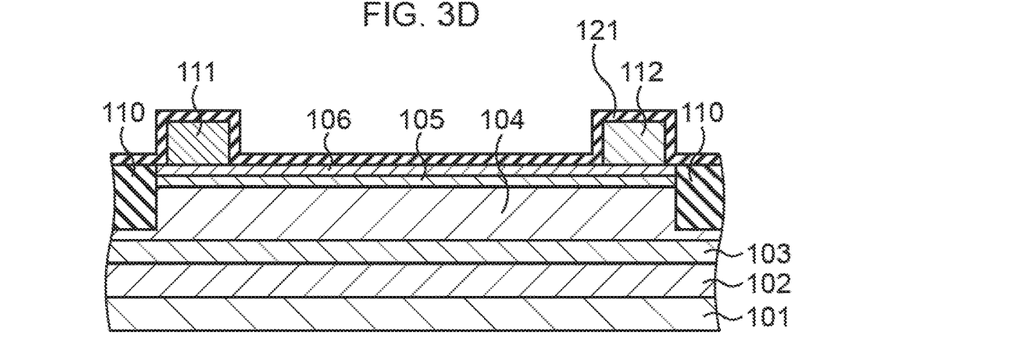

Subsequently, as illustrated in FIG. 3D, the insulating film 121 covering the source electrode 111 and the drain electrode 112 is formed on the cap layer 106. The insulating film 121 may be formed by a chemical vapor deposition (CVD) method, an atomic layer deposition (ALD) method, or a sputtering method, for example.

Figure 3E:
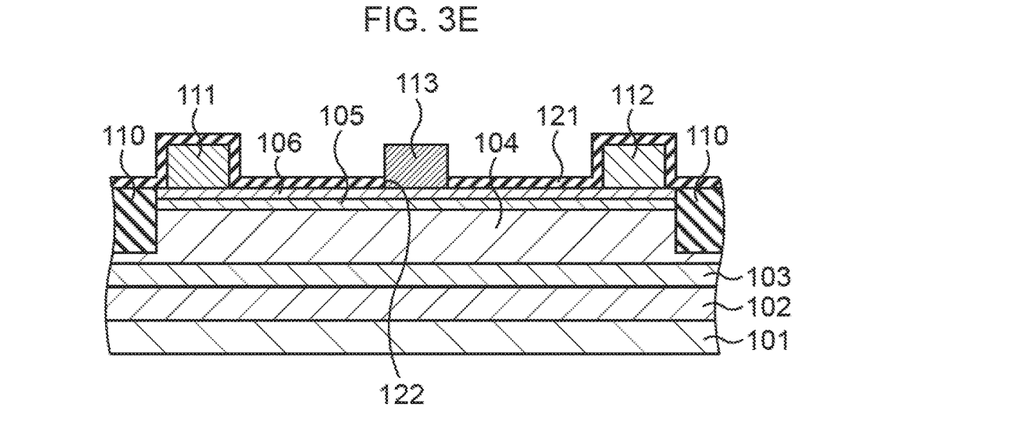

Then, as illustrated in FIG. 3E, the opening 122 is formed in a region of the insulating film 121, in which the gate electrode 113 is to be formed. The opening 122 may be formed by dry etching, for example. The opening 122 may be formed by wet etching or ion milling. Thereafter, the gate electrode 113 is formed in the opening 122. The gate electrode 113 may be formed by the lift-off method, for example.

Figure 3F:
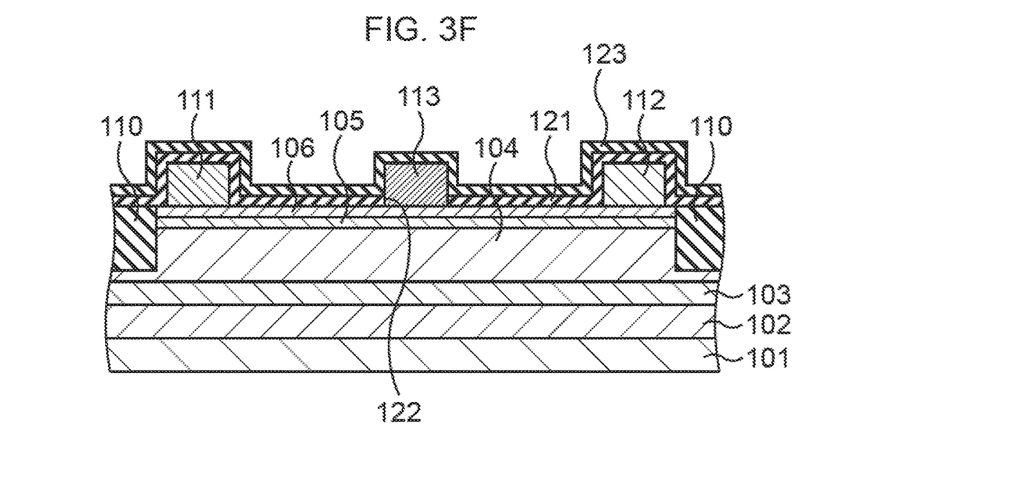

Thereafter, as illustrated in FIG. 3F, the insulating film 123 covering the gate electrode 113 is formed on the insulating film 121. The insulating film 123 may be formed by the CVD method, the ALD method, or the sputtering method, for example, in a similar manner to the insulating film 121.

Subsequently, a protective film, a wiring and the like are formed as necessary to thereby complete the compound semiconductor device 100.

The concentration of Fe contained in the first layer 103 is not particularly limited, and is preferably decided by taking factors such as the thickness of the channel layer 104, and the concentration of Al contained in the channel layer 104 into consideration.

The thicker the channel layer 104 is, the further difficult the influence of dislocation propagated from the layer under the channel layer 104 such as the first layer 103 is to be exerted on the 2DEG region 131, but the further difficult it is for a depletion layer to reach the substrate side during off-operation so that off-leakage characteristics deteriorate. Thus, the thickness of the channel layer 104 is preferably about 700 nm to 1200 nm, more preferably 1000 nm.

An Al composition of the barrier layer 105 is preferably 30% or less, from a viewpoint of suppressing the reduction in crystallinity due to the lattice mismatch.

(Second Embodiment)

Figure 4:
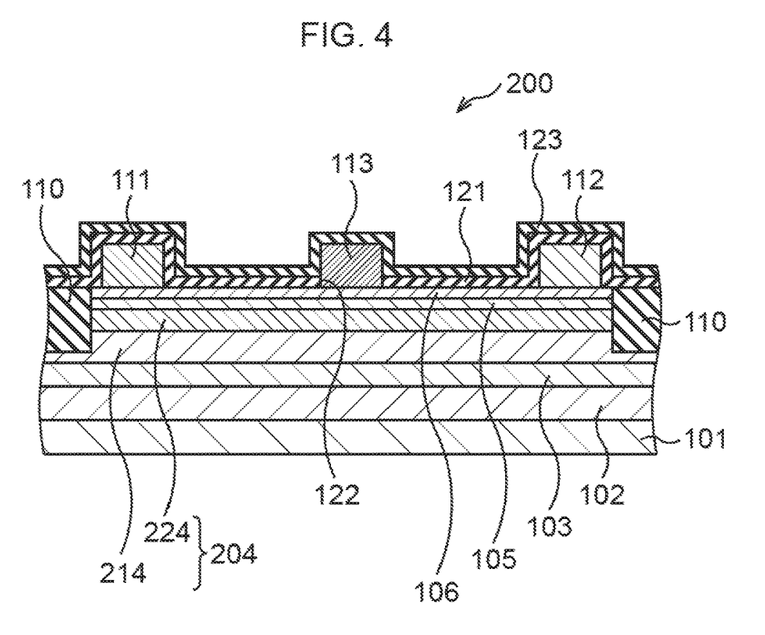
FIG. 4 is a sectional view illustrating a structure of a compound semiconductor device according to a second embodiment.

Next, a second embodiment will be described. The second embodiment relates to an example of a compound semiconductor device with HEMT. FIG. 4 is a sectional view illustrating a structure of the compound semiconductor device according to the second embodiment.

As illustrated in FIG. 4, a compound semiconductor device 200 according to the second embodiment includes a channel layer 204 instead of the channel layer 104 in the compound semiconductor device 100 according to the first embodiment. The channel layer 204 includes an Al-doped region 214, and an undoped region 224 on the Al-doped region 214. The Al-doped region 214 is, for example, a GaN layer whose Al concentration is $5 \times 10^{17}$ atoms/$cm^3$ or more and less than $1 \times 10^{19}$ atoms/$cm^3$, and which has not been intentionally doped with impurity other than Al. The Al-doped region 214 is an example of an Al-containing region. The undoped region 224 is, for example, a GaN layer whose thickness is about 30 nm to 300 nm, and which has not been intentionally doped with impurity. Two-dimensional electron gas exists in the undoped region 224, and a 2DEG region is included in the undoped region 224. A maximum value of the Al concentration between the 2DEG region and the first layer 103 is less than $1 \times 10^{19}$ atoms/$cm^3$. Al diffused from the layers such as the buffer layer 102 and the barrier layer 105 exists in the channel layer 204, but the Al concentration at an upper surface of the channel layer 204 is less than $5 \times 10^{17}$ atoms/$cm^3$. The other configuration is similar to that of the first embodiment.

The second embodiment can also achieve an effect similar to that of the first embodiment. Besides, since the 2DEG region is included in the undoped region 224 which has not been intentionally doped with impurity, further excellent electron mobility can be obtained.

In manufacturing the compound semiconductor device 200 according to the second embodiment, following the formation of the first layer 103, the supply of the Al source is continued but the supply of the Fe source is stopped so as to form the Al-doped region 214, for example. After the formation of the Al-doped region 214, the supply of the Al source is stopped so as to form the undoped region 224. The other processes are conducted in a manner similar to that of the first embodiment.

(Third Embodiment)

Figure 5:
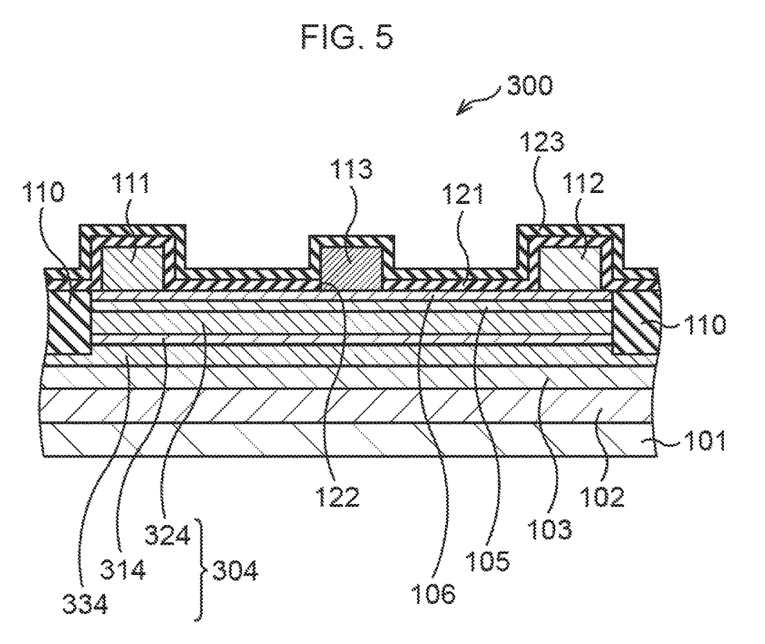
FIG. 5 is a sectional view illustrating a structure of a compound semiconductor device according to a third embodiment.

Next, a third embodiment will be described. The third embodiment relates to an example of a compound semiconductor device with HEMT. FIG. 5 is a sectional view illustrating a structure of the compound semiconductor device according to the third embodiment.

As illustrated in FIG. 5, a compound semiconductor device 300 according to the third embodiment includes a channel layer 304 instead of the channel layer 104 in the compound semiconductor device 100 according to the first embodiment. The channel layer 304 includes an undoped region 334, an Al-doped region 314 on the undoped region 334, and an undoped region 324 on the Al-doped region 314. The Al-doped region 314 is, for example, a GaN layer whose Al concentration is $5 \times 10^{17}$ atoms/$cm^3$ or more and less than $1 \times 10^{19}$ atoms/$cm^3$, and which has not been intentionally doped with impurity other than Al. The Al-doped region 314 is an example of the Al-containing region. Each of the undoped regions 334 and 324 is a GaN layer which has not been intentionally doped with impurity. A thickness of the undoped region 324 is about 30 nm to 300 nm, for example, two-dimensional electron gas exists in the undoped region 324, and a 2DEG region is included in the undoped region 324. A maximum value of the Al concentration between the 2DEG region and the first layer 103 is less than $1\times10^{19}$ atoms/cm$^3$. Al diffused from the layers such as the buffer layer 102 and the barrier layer 105 exists in the channel layer 304, but the Al concentration at an upper surface of the channel layer 304 is less than $5\times10^{17}$ atoms/cm$^3$. The other configuration is similar to that of the first embodiment.

The third embodiment can also achieve an effect similar to that of the second embodiment. Besides, since dislocation propagated from the lower layer is annihilated by being bent at an interface between the Al-doped region 314 and the undoped region 334, it is expected that the dislocation density is decreased in the undoped region 324. Therefore, it is possible to obtain high 2DEG mobility which is equal to or higher than the 2DEG mobility in the second embodiment.

In manufacturing the compound semiconductor device 300 according to the third embodiment, following the formation of the first layer 103, the supply of the Fe source is stopped so as to form the undoped region 334, for example. After the formation of the undoped region 334, an Al source starts to be supplied so as to form the Al-doped region 314. After the formation of the Al-doped region 314, the supply of the Al source is stopped so as to form the undoped region 324. The other processes are conducted in a manner similar to that of the first embodiment.

Figure 6:
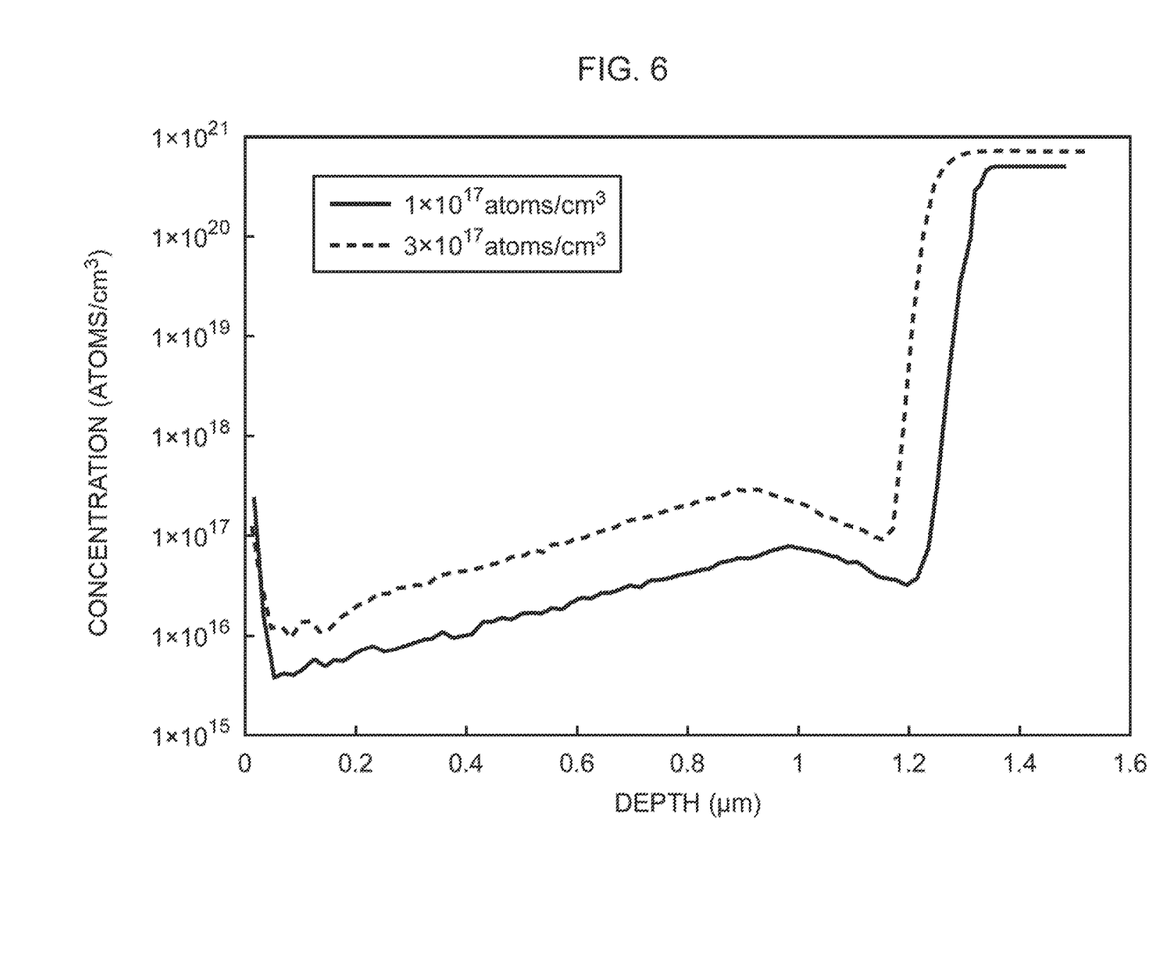
FIG. 6 is a drawing illustrating a relation between a peak concentration of Fe in a first layer being doped with Fe and a concentration gradient of Fe in a channel layer.

Next, an experiment conducted by the inventors of the present application and results thereof will be described. The inventors of the present application examined whether the Fe concentration in the first layer being doped with Fe exerts an influence on the concentration gradient of Fe in the channel layer, and as a result, no significant influence on the concentration gradient of the Fe concentration was confirmed, as illustrated in FIG. 6. Specifically, in each of cases where the peak concentration is $1\times10^{17}$ atoms/cm$^3$, and the peak concentration is $3\times10^{17}$ atoms/cm$^3$, there was no significant difference in the concentration gradient of Fe. This means that, if a channel layer is made of undoped GaN, there is only one option left, which is, to set low Fe concentration in the first layer or to increase the thickness of the channel layer, in order to sufficiently reduce the residual concentration of Fe in the 2DEG region. However, both of the reduction in the Fe concentration and the increase in thickness of the channel layer make it difficult to obtain sufficient pinch-off performance in the device characteristics.

Figure 7:
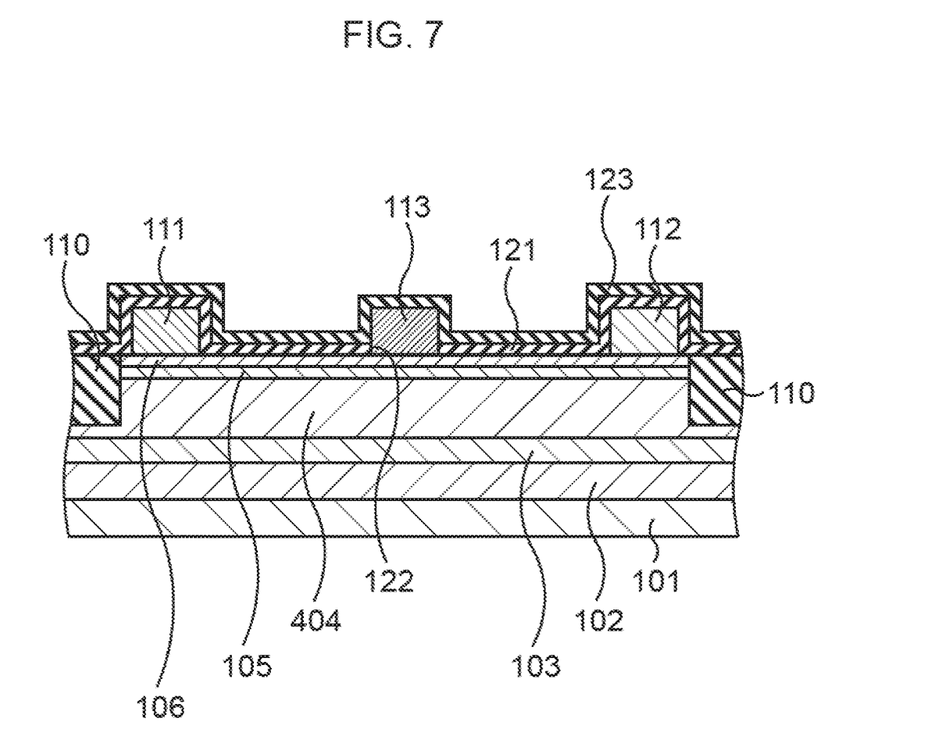
FIG. 7 is a sectional view illustrating a structure of a compound semiconductor device of a reference example.

The inventors of the present application manufactured a compound semiconductor device according to the first embodiment, and a concentration profile of Fe and Al was measured. A GaN layer with a thickness of 300 nm was formed while supplying Cp$_2$Fe so that the concentration of Fe became $3\times10^{17}$ atoms/cm$^3$ for the first layer 103. A GaN layer with a thickness of 1000 nm was formed while supplying TMA so that the concentration of Al became $5\times10^{18}$ atoms/cm$^3$ for the channel layer 104. Then, the concentration profile of Fe and Al was measured by secondary ion mass spectrometry (SIMS). For the comparison, similar measurement was performed also on a reference example in which a channel layer 404 of GaN was formed without being intentionally doped with Al instead of the channel layer 104, as illustrated in FIG. 7. Results of these are illustrated in FIG. 8.

Figure 8:
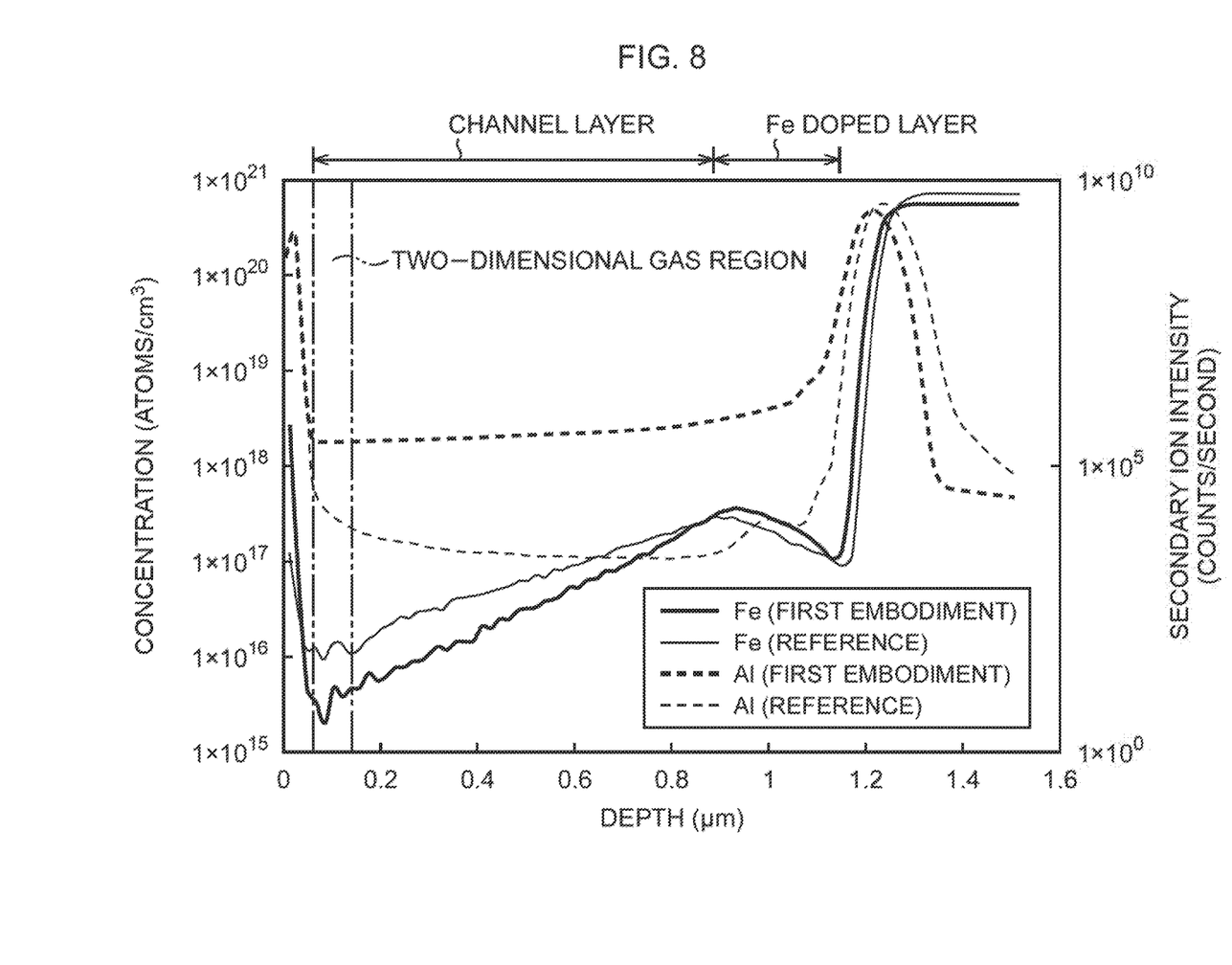
FIG. 8 is a drawing illustrating a relation between presence or absence of an Al-containing region and an Fe concentration in a two-dimensional electron gas region.

As illustrated in FIG. 8, the concentration of Fe in the region in which two-dimensional electron gas exists was about $5\times10^{15}$ atoms/cm$^3$ in the first embodiment, while that was about $1\times10^{16}$ atoms/cm$^3$ in the reference example. Specifically, the concentration of Fe in the region in which the two-dimensional electron gas exists in the first embodiment was about half that of the reference example. The experiment confirms that in the compound semiconductor device according to the first embodiment, it is possible to suppress the diffusion of Fe without changing the film thickness of the channel layer or changing the doping concentration of Fe. Therefore, it is possible to suppress the deterioration of device characteristics such as the reduction in mobility due to the diffusion of Fe and current collapse, while obtaining good pinch-off characteristics.

(Fourth Embodiment)

Figure 9:
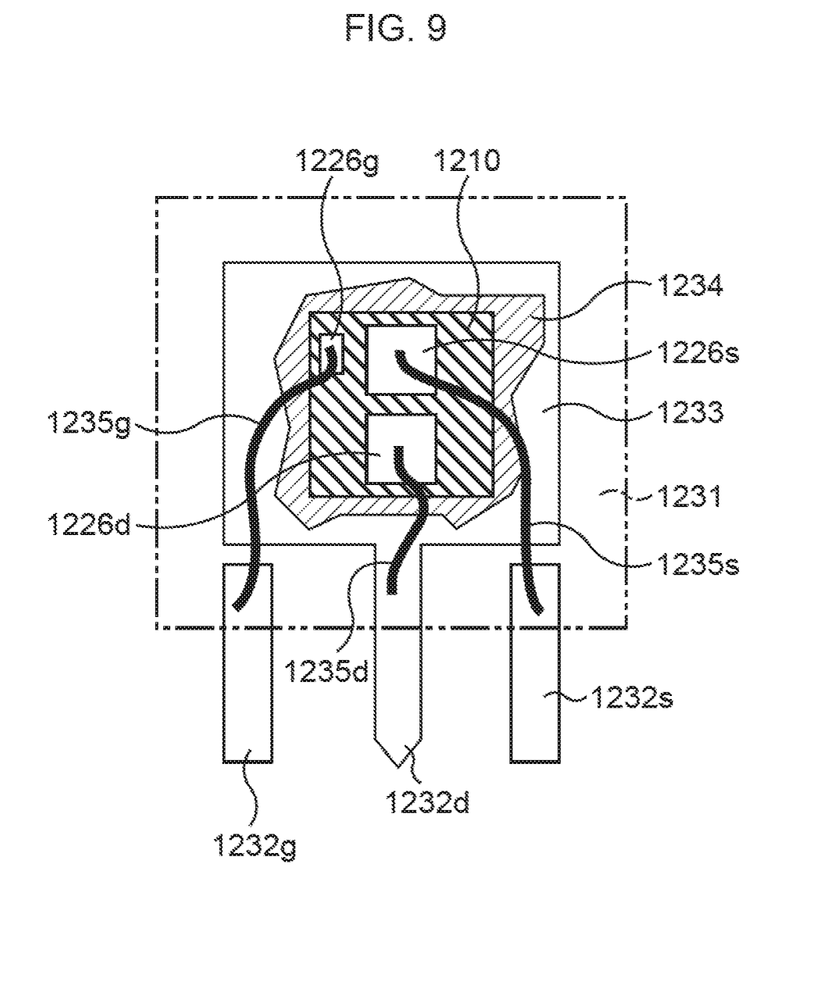
FIG. 9 is a view illustrating a discrete package according to a fourth embodiment.

Next, a fourth embodiment is described. The fourth embodiment relates to a discrete package of a compound semiconductor device which includes a nitride semiconductor HEMT. FIG. 9 is a view illustrating the discrete package according to the fourth embodiment.

In the fourth embodiment, as illustrated in FIG. 9, a back surface of a HEMT chip 1210 of the compound semiconductor device according to any one of the first to third embodiments is fixed on a land (die pad) 1233, using a die attaching agent 1234 such as solder. One end of a wire 1235d such as an Al wire is bonded to a drain pad 1226d, to which the drain electrode 112 is connected, and the other end of the wire 1235d is bonded to a drain lead 1232d integral with the land 1233. One end of a wire 1235s such as an Al wire is bonded to a source pad 1226s, to which the source electrode 111 is connected, and the other end of the wire 1235s is bonded to a source lead 1232s separated from the land 1233. One end of a wire 1235g such as an Al wire is bonded to a gate pad 1226g, to which the gate electrode 113 is connected, and the other end of the wire 1235g is bonded to a gate lead 1232g separated from the land 1233. The land 1233, the HEMT chip 1210 and so forth are packaged with a molding resin 1231, so as to project outwards a portion of the gate lead 1232g, a portion of the drain lead 1232d, and a portion of the source lead 1232s.

The discrete package may be manufactured by the procedures below, for example. First, the HEMT chip 1210 is bonded to the land 1233 of a lead frame, using a die attaching agent 1234 such as solder. Next, with the wires 1235g, 1235d and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame, respectively, by wire bonding. The molding with the molding resin 1231 is conducted by a transfer molding process. The lead frame is then cut away.

(Fifth Embodiment)

Figure 10:
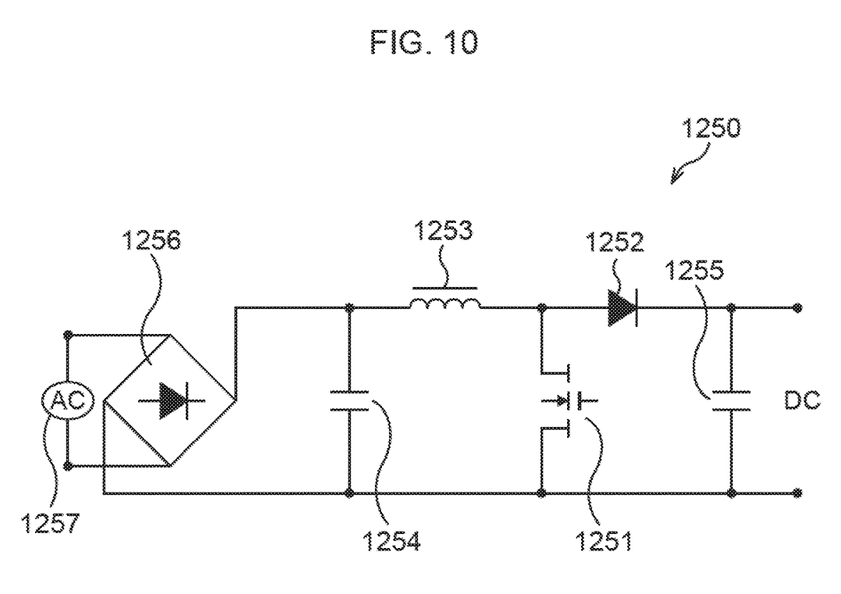
FIG. 10 is a wiring diagram illustrating a PFC circuit according to a fifth embodiment.

Next, a fifth embodiment is described. The fifth embodiment relates to a PFC (power factor correction) circuit equipped with a compound semiconductor device which includes a nitride semiconductor HEMT. FIG. 10 is a wiring diagram illustrating the PFC circuit according to the fifth embodiment.

A PFC circuit 1250 has a switching element (transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. A gate driver is connected to the gate electrode of the switching element 1251. The AC 1257 is connected between both terminals of the capacitor 1254 via the diode bridge 1256. A DC power source (DC) is connected between both terminals of the capacitor 1255. In the embodiment, the compound semiconductor device according to any one of the first to third embodiments is used as the switching element 1251.

In the method of manufacturing the PFC circuit 1250, for example, the switching element 1251 is connected to the diode 1252, the choke coil 1253 and so forth with solder, for example.

(Sixth Embodiment)

Figure 11:
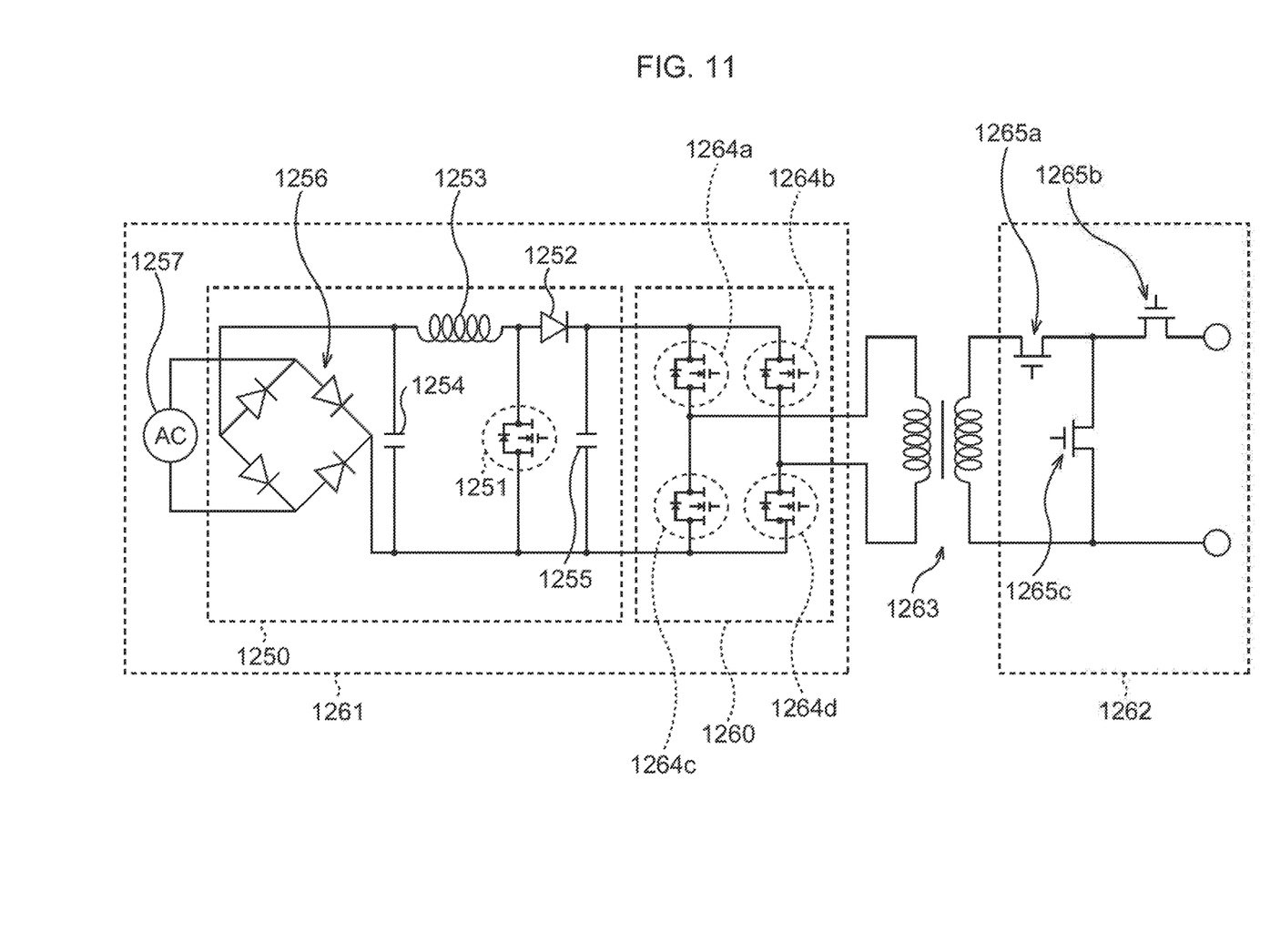
FIG. 11 is a wiring diagram illustrating a power supply apparatus according to a sixth embodiment.

Next, a sixth embodiment is described. The sixth embodiment relates to a power supply apparatus equipped with a compound semiconductor device which includes a nitride semiconductor HEMT. FIG. 11 is a wiring diagram illustrating the power supply apparatus according to the sixth embodiment.

The power supply apparatus includes a high-voltage, primary-side circuit 1261, a low-voltage, secondary-side circuit 1262, and a transformer 1263 arranged between the primary-side circuit 1261 and the secondary-side circuit 1262.

The primary-side circuit 1261 includes the PFC circuit 1250 according to the fifth embodiment, and an inverter circuit, which may be a full-bridge inverter circuit 1260, for example, connected between both terminals of the capacitor 1255 in the PFC circuit 1250. The full-bridge inverter circuit 1260 includes a plurality of (four, in the embodiment) switching elements 1264a, 1264b, 1264c and 1264d.

The secondary-side circuit 1262 includes a plurality of (three, in the embodiment) switching elements 1265a, 1265b and 1265c.

In the embodiment, the compound semiconductor device according to any one of first to third embodiments is used for the switching element 1251 of the PFC circuit 1250, and for the switching elements 1264a, 1264b, 1264c and 1264d of the full-bridge inverter circuit 1260. The PFC circuit 1250 and the full-bridge inverter circuit 1260 are components of the primary-side circuit 1261. On the other hand, a silicon-based general MIS-FET (field effect transistor) is used for the switching elements 1265a, 1265b and 1265c of the secondary-side circuit 1262.

(Seventh Embodiment)

Figure 12:
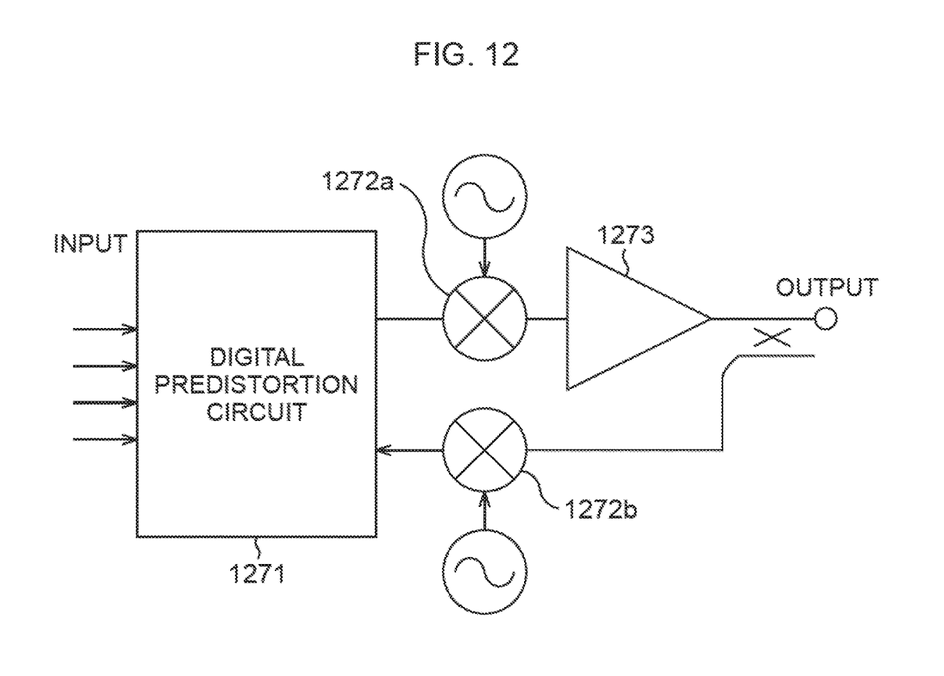
FIG. 12 is a wiring diagram illustrating an amplifier according to a seventh embodiment.

Next, a seventh embodiment is explained. The seventh embodiment relates to an amplifier equipped with the compound semiconductor device which includes a nitride semiconductor HEMT. FIG. 12 is a wiring diagram illustrating the amplifier according to the seventh embodiment.

The amplifier includes a digital predistortion circuit 1271, mixers 1272a and 1272b, and a power amplifier 1273.

The digital predistortion circuit 1271 compensates non-linear distortion in input signals. The mixer 1272a mixes the input signal having the non-linear distortion already compensated, with an AC signal. The power amplifier 1273 includes the compound semiconductor device according to any one of the first to third embodiments, and amplifies the input signal mixed with the AC signal. In the embodiment, the signal on the output side may be mixed, upon switching, with an AC signal by the mixer 1272b, and may be sent back to the digital predistortion circuit 1271. The amplifier may be used as a high-frequency amplifier or a high-output amplifier.

According to the above-described compound semiconductor device and the like, since the channel layer includes the appropriate Al-containing region, it is possible to suppress the reduction in characteristics due to the diffusion of Fe from the first layer being doped with Fe.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a first layer of nitride semiconductor, the first layer being doped with Fe;
   a channel layer of nitride semiconductor above the first layer; and
   a barrier layer of nitride semiconductor above the channel layer, wherein the channel layer includes:
   a first undoped region in which a two-dimensional electron gas exists;
   an Al-containing region between the first undoped region and the first layer, an Al concentration in the Al-containing region being $5\times10^{17}$ atoms/cm$^3$ or more and less than $1\times10^{19}$ atoms/cm$^3$; and
   a second undoped region between the Al-containing region and the first layer.

2. The compound semiconductor device according to claim 1, wherein an Fe concentration in the first layer is lower than the Al concentration in the Al-containing region.

3. The compound semiconductor device according to claim 1, wherein a maximum value of an Al concentration between the first undoped region and the first layer is less than $1\times10^{19}$ atoms/cm$^3$.

4. The compound semiconductor device according to claim 1, wherein an Fe concentration in the first undoped region is $5\times10^{15}$ atoms/cm$^3$ or less.

5. A power supply apparatus, comprising
   a compound semiconductor device, wherein the compound semiconductor device comprises:
   a first layer of nitride semiconductor, the first layer being doped with Fe;
   a channel layer of nitride semiconductor above the first layer; and
   a barrier layer of nitride semiconductor above the channel layer, wherein the channel layer includes:
   a first undoped region in which a two-dimensional electron gas exists;
   an Al-containing region between the first undoped region and the first layer, an Al concentration in the Al-containing region being $5\times10^{17}$ atoms/cm$^3$ or more and less than $1\times10^{19}$ atoms/cm$^3$; and
   a second undoped region between the Al-containing region and the first layer.

6. An amplifier, comprising
   a compound semiconductor device, wherein the compound semiconductor device comprises:
   a first layer of nitride semiconductor, the first layer being doped with Fe;
   a channel layer of nitride semiconductor above the first layer; and
   a barrier layer of nitride semiconductor above the channel layer, wherein the channel layer includes:

a first undoped region in which a two-dimensional electron gas exists; and an Al-containing region between the first undoped region and the first layer, an Al concentration in the Al-containing region being $5\times10^{17}$ atoms/cm$^3$ or more and less than $1\times10^{19}$ atoms/cm$^3$; and a second undoped region between the Al-containing region and the first layer.

7. A method of manufacturing a compound semiconductor device, comprising:

forming a channel layer of nitride semiconductor above a first layer of nitride semiconductor, the first layer being doped with Fe; and forming a barrier layer of nitride semiconductor above the channel layer, wherein the forming the channel layer includes:

forming a first undoped region in which a two-dimensional electron gas exists;

forming an Al-containing region between the first undoped region and the first layer, an Al concentration in the Al-containing region being $5\times10^{17}$ atoms/cm$^3$ or more and less than $1\times10^{19}$ atoms/cm$^3$; and forming a second undoped region between the Al-containing region and the first layer.

8. The method according to claim 7, wherein an Al concentration at an upper surface of the channel layer is less than $5\times10^{17}$ atoms/cm$^3$.

9. The method according to claim 7, wherein a maximum value of an Al concentration between the first undoped region and the first layer is less than $1\times10^{19}$ atoms/cm$^3$.

10. The method according to claim 7, wherein an Fe concentration in the first undoped region is $5\times10^{15}$ atoms/cm$^3$ or less.

* * * * *